United States Patent [19]

Etarski et al.

[11] Patent Number: 4,778,975
[45] Date of Patent: Oct. 18, 1988

[54] ELECTRICAL SUPPLY CIRCUIT FOR ELECTRON BEAM EVAPORATORS

[75] Inventors: Vladimir S. Etarski; Vasil B. Penchev; Vencislav Bonev, all of Ruse, Bulgaria

[73] Assignee: V T U "A. Kanchev, Ruse, Burma

[21] Appl. No.: 43,897

[22] Filed: Apr. 29, 1987

[51] Int. Cl.$^4$ .............................................. B23K 15/00
[52] U.S. Cl. ......................... 219/121.34; 219/121.12; 315/111.81; 315/141
[58] Field of Search ................. 219/121 EA, 121 EC, 219/121 ED, 121 EF, 121 EG, 121 EZ, 121 EB, 121 EM; 373/12, 14, 16, 10; 315/111.81, 141, 107, 39, 94, 95, 111.21

[56] References Cited

U.S. PATENT DOCUMENTS

| | | | |
|---|---|---|---|
| 3,397,672 | 8/1968 | Dykeman et al. | 219/121 EA X |
| 3,424,946 | 1/1969 | Zulinski | 315/141 X |
| 3,488,426 | 1/1970 | Dietzel | 373/12 |
| 3,748,536 | 7/1973 | Andresen | 219/121 EA X |
| 3,909,663 | 9/1975 | Thomas et al. | 219/121 EA X |
| 4,019,091 | 4/1977 | Schoenmakers | 315/111.81 |
| 4,021,636 | 5/1977 | Von Walter | 219/121 EA |
| 4,236,058 | 11/1980 | Corcelle et al. | 219/121 EC |
| 4,335,297 | 6/1982 | Little | 315/111.81 X |
| 4,475,063 | 10/1984 | Aston | 315/111.81 |

Primary Examiner—C. L. Albritton
Attorney, Agent, or Firm—Klein and Vibber

[57] ABSTRACT

A circuit for the electrical supply of a plurality of electron beam evaporators has application in heat and thermochemical treatment processes such as welding, fusing, zonal cleaning of materials, dimensional treatment, application of coatings, etc. A multi-phase step-up transformer is connected to the output of a voltage regulation unit. One of the outputs of each phase of the secondary winding of the transformer, as well as the processed material and the anodes of the electronic beam evaporators are grounded. The deflection and focusing lenses of the evaporators are connected to the outputs of an electron beam control unit and the other outputs of each phase of the secondary winding of the transformer are directly coupled to the cathode of the respective evaporator and, across a voltage and current transformation unit, to the inputs of the electron beam control unit. The advantages of the circuit of the invention include: reduced number of high voltage components, improved reliability and efficiency of the equipment and facilities for complex technological operations.

2 Claims, 1 Drawing Sheet

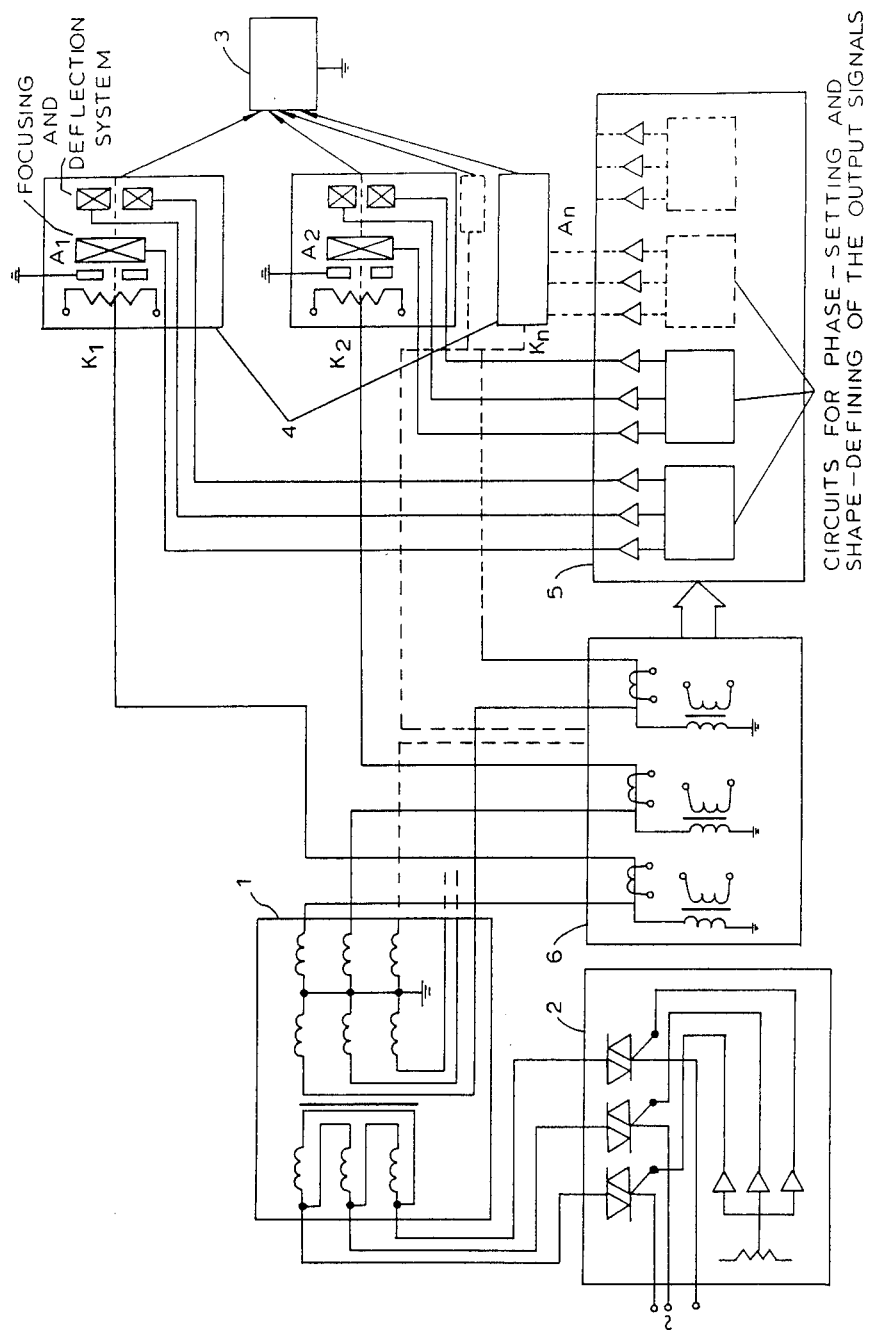

ELECTRICAL SUPPLY CIRCUIT FOR ELECTRON BEAM EVAPORATORS

FIELD OF THE INVENTION

This invention relates to an electrical supply circuit for electron beam evaporators finding application in heat and thermochemical treatment processes such as welding, fusing, zonal cleaning of materials, dimensional treatment, application of coatings, etc. This application is related to coassigned, copending application Ser. No. 022,462 for ELECTRON BEAM CONTROL CIRCUIT IN ELECTRON BEAM EVAPORATORS, filed Mar. 6, 1987; and the disclosure of said application is incorporated herein by reference.

BACKGROUND OF THE INVENTION

A known circuit for electron beam evaporator electrical supply is disclosed in "Prospectus Material of Leybold Heraeus, FRG - Hannau, and Cologne." The known circuit consists of a multiphase step-up transformer, the primary winding of which is connected to the mains supply across a voltage regulation unit. One of the outputs of every phase of its secondary winding, the one output of a high voltage rectifier, as well as one of the outputs of a high voltage smoothing filter, as well as the anode of the electron beam evaporator and the processed material are grounded. The other output of every phase of the secondary transformer winding is connected to the respective input of the high voltage multiphase rectifier, the second output of which is connected to the input of the smoothing filter. The preheated cathode of the electron beam evaporator is connected to the other output of the filter. The electromagentic deflection and focusing lenses of the electron beam evaporator are connected to the respective outputs of an electron beam control unit.

A disadvantage of the know circuit is the increased number of high voltage components, resulting in its larger overall dimensions, its reduced reliability and its increased cost. The known circuit has reduced efficiency and limited potentials for carrying out more complex technological operations.

It is an object of this invention to provide a circuit for the electrical supply of electron beam evaporators having a reduced number of high voltage components, i.e. higher reliability and reduced overall dimensions, supplying a plurality of evaporators with greater opportunities for the materialization of more complex technological operations and having a higher efficiency factor.

SUMMARY OF THE INVENTION

The present invention provides an electrical supply circuit for electron beam evaporators containing a multiphase step-up transformer, the primary winding of which is connected to the output of a voltage regulation unit. One of the outputs of each phase of the transformer secondary winding, as well as the processed material and the anodes of the electron beam evaporators are grounded. The deflection and focusing lenses of the evaporators are connected to the respective outputs of a control unit of the electron beams. The other output of each phase of the secondary winding of the transformer is directly coupled to the cathode of the respective electron beam evaporator and across a voltage and current transformation unit to the inputs of the electron beam control unit.

The advantages of this invention are: reduced number of high voltage components, improved reliability and reduced overall dimensions of the equipment, as well a higher efficiency factor and capabilities for carrying out complex technological operations and treatments.

BRIEF DESCRIPTION OF THE DRAWING

With these and other objects in view, which will become apparent in the following detailed description, the present invention, which is shown by example only, will be clearly understood in connection with the accompanying drawing, in which the single FIGURE is a schematic diagram of an exemplary embodiment of the circuit of the invention.

DESCRIPTION OF THE PREFERRED EMBODIMENT

Refering now to the FIGURE, the primary winding of a step-up transformer 1 is connected to the output of a voltage regulation unit 2. One of the outputs of every phase of the secondary winding of transformer 1 is grounded. The processed material 3 and the anodes (A1 through An) of electron beam evaporators 4 are also grounded. The deflection and focusing lenses of the evaporators 4 are connected to the respective outputs of an electron beam control unit 5.

The other output of each phase of the secondary winding of the transformer 1 is directly coupled to the cathode (K1 through Kn) of the respective electron beam evaporator 4, and across a voltage and current transformation unit 6 to the inputs of the electron beam control unit 5.

The circuit operates as follows: High voltage is produced across the outputs of every phase of the secondary winding of the multiphase transformer 1 set by the voltage regulation unit 2. This high voltage is directly fed (with no rectification and filtering) to one of the electron beam evaporators. The electron beam evaporators 4 being in a vacuum chamber simultaneously act as diode valves for which reason the current across every electron beam evaporator and the voltage applied to it does not remain constant in time. In case of static effect on the deflection and focusing lenses, periodic pulsing defocusing and oscillation of the electron beams would be produced. For this reason their dynamic deflection and focusing by voltage tracking has been introduced by means of the voltage and current transformation unit 6 and the electron beam control unit 5. The whole current half-waves (from 0 to 180 degrees) pass through every evaporator which leads to an energy increase theoretically with approximately 38% compared to the three-phase bridge rectifier used in the known circuit, where a part of the half-waves (from 60 to 120 degrees) passes through every diode.

We claim:

1. An electrical supply circuit for powering a plurality of electron beam evaporators wherein said electron beam evaporators each have an anode, a cathode, and said evaporators are used to treat a grounded processed material, said circuit comprising a multiphase step-up transformer, said transformer having a primary winding and a secondary winding, said secondary winding having a plurality of outputs of different phase, said plurality of outputs comprising a pair of outputs for each phase, one of the pair of outputs for each phase being grounded;

voltage regulation means, said voltage regulation means having an output, the transformer primary winding being connected to the output of the voltage regulation means:

the anode of each of each the electron beam evaporators being grounded and the cathode of each of the electron beam evaporators being directly connected to a respective other of the pair of outputs for each phase.

2. An electrical supply circuit as claimed in claim 1, further comprising each of said electron beam evaporators having a deflection lens and a focusing lens;

circuit means for electron beam control, said circuit means for electron beam control having a plurality of inputs and outputs, the outputs of said circuit means for electron beam control being connected to respective said lenses; and circuit means for voltage and current transformation, said circuit means for voltage and current transformation having a plurality of inputs and a plurality of outputs, the inputs of said circuit means for voltage and current transformation being connected to the respective cathodes of said electron beam evaporators and the outputs of said circuit means for voltage and current transformation being connected to the respective inputs of said circuit means for electron beam control.

* * * * *

UNITED STATES PATENT AND TRADEMARK OFFICE
CERTIFICATE OF CORRECTION

PATENT NO. : 4,779,975

DATED : October 25, 1988

INVENTOR(S) : Byoung Y. Kim

It is certified that error appears in the above-identified patent and that said Letters Patent is hereby corrected as shown below:

In Column 2, at line 1, change "Equation 2 above. Thus" to --Equation 2 above.) Thus--.

In Column 5, at line 26, change "of the counter/time circuit" to --of the counter/timer circuit--.

In Column 5, at line 39, change "A shown in Figure 1" to --As shown in Figure 1--.

In Column 12, at line 47, change "curve 215 translates" to --curve 214 translates--.

In Column 15, at line 60, change "$\Delta t_1$," to --$\Delta t_1'$,--.

In Column 17, at line 15, change "embodiment of the detection signal" to --embodiment of the detection system--.

UNITED STATES PATENT AND TRADEMARK OFFICE
CERTIFICATE OF CORRECTION

PATENT NO. : 4,779,975

DATED : October 25, 1988

INVENTOR(S) : Byoung Y. Kim

It is certified that error appears in the above-identified patent and that said Letters Patent is hereby corrected as shown below:

In Column 17, at line 48, change "between he zero-crossings" to --between the zero-crossings--.

In Column 23, at line 16, change "modulators" to --modulator--

In Column 24, at line 48, change "point" to --points--.

Signed and Sealed this

Twenty-eighth Day of April, 1992

Attest:

HARRY F. MANBECK, JR.

*Attesting Officer*   *Commissioner of Patents and Trademarks*